(12) United States Patent
Robbins et al.

(10) Patent No.: US 7,611,157 B2
(45) Date of Patent: *Nov. 3, 2009

(54) METHOD AND APPARATUS FOR AN ELECTRONIC EQUIPMENT RACK

(75) Inventors: Jody G. Robbins, Phoenix, AZ (US); William E. Woodbury, II, Apache Junction, AZ (US); Richard M. Chaput, Phoenix, AZ (US)

(73) Assignee: Elliptical Mobile Solutions, LLC, Chandler, AZ (US)

( * ) Notice: Subject to any disclaimer, the term of this patent is extended or adjusted under 35 U.S.C. 154(b) by 578 days.

This patent is subject to a terminal disclaimer.

(21) Appl. No.: 11/321,970

(22) Filed: Dec. 29, 2005

(65) Prior Publication Data

US 2007/0151779 A1   Jul. 5, 2007

Related U.S. Application Data

(63) Continuation of application No. 11/317,414, filed on Dec. 22, 2005, now Pat. No. 7,461,849.

(51) Int. Cl.
*B62B 1/00* (2006.01)
(52) U.S. Cl. ................ 280/47.35; 280/47.34; 280/79.3; 312/249.11
(58) Field of Classification Search ............ 280/47.35, 280/47.34, 43.17, 43.23, 43.24, 6.158, 6.157, 280/6.159, 79.3; 34/402, 210, 410, 417; 312/249.11, 330.1, 249.12

See application file for complete search history.

(56) References Cited

U.S. PATENT DOCUMENTS

| | | | | |
|---|---|---|---|---|
| 2,778,704 A | * | 1/1957 | Joachim | 312/249.12 |
| 4,948,166 A | * | 8/1990 | Kaneko | 280/5.501 |
| 4,958,850 A | * | 9/1990 | Buma et al. | 280/6.157 |
| 5,074,569 A | * | 12/1991 | Kawabata | 280/6.158 |
| 5,829,767 A | * | 11/1998 | Grossman | 280/47.35 |
| 5,845,914 A | * | 12/1998 | Lenkman | 280/43.17 |
| 6,034,355 A | * | 3/2000 | Naderi et al. | 219/387 |
| 6,036,201 A | * | 3/2000 | Pond et al. | 280/6.15 |
| 6,123,312 A | * | 9/2000 | Dai | 248/550 |
| 6,224,069 B1 | * | 5/2001 | Chan | 280/6.159 |
| 6,249,990 B1 | * | 6/2001 | Tannous et al. | 34/402 |
| 7,038,126 B2 | * | 5/2006 | Solet | 220/3.2 |
| 7,055,833 B2 | * | 6/2006 | Wixted et al. | 280/47.34 |

OTHER PUBLICATIONS

USPTO communication dated Apr. 21, 2008 concerning co-pending U.S. Appl. No. 11/317,414, filed Dec. 22, 2005 by Jodi G. Robbins.
ISA/US, International Search Report for counterpart foreign application PCT/US2006/062069, Nov. 10, 2008, pp. 1-2.

(Continued)

*Primary Examiner*—Hau V Phan
(74) *Attorney, Agent, or Firm*—Michael T. Wallace

(57) ABSTRACT

A method and apparatus for an electronic equipment rack that provides mobility through directional self-propulsion and multi-axis suspension. The electronic equipment rack further provides self-powered operation and environmental control with wireless access, while protecting against unauthorized access, electromagnetic interference (EMI), and dust contamination. An alternate embodiment provides a non-mobile electronic equipment rack with multi-axis suspension, while optionally providing wireless access and protection against unauthorized access and the environment.

20 Claims, 6 Drawing Sheets

OTHER PUBLICATIONS

ISA/US, Written Opinion for counterpart foreign application PCT/US2006/062069, Nov. 10, 2008, pp. 1-3.

USPTO, Office Action for copending U.S. Appl. No. 11/608,561, filed Oct. 17, 2008, pp. 1-8.

USPTO, Office Action for copending U.S. Appl. No. 11/608,386, filed Feb. 24, 2009, pp. 1-12.

USPTO, Office Action for copending U.S. Appl. No. 11/321,944, filed Jan. 12, 2009, pp. 1-11.

* cited by examiner

METHOD AND APPARATUS FOR AN ELECTRONIC EQUIPMENT RACK

This is a continuation application of application Ser. No. 11/317,414, filed Dec. 22, 2005, now U.S. Pat. No. 7,461,849 the content of which is incorporated herein by reference in its entirety.

FIELD OF THE INVENTION

The present invention generally relates to electronic equipment racks, and more particularly to self-powered, electronic, air conditioned electronic equipment racks with multi-axis suspension.

BACKGROUND

The proliferation of technology in today's society has created such a dependence that life without it would likely cease to exist as it is known today. For example, the convenience of communication devices such as wireless telephones, wireless pagers, and personal digital assistants (PDAs) have facilitated visual, audible, and tactile communications to be conducted virtually anytime and anywhere.

Portable computing devices, such as laptop computers, have also contributed to technology proliferation, since they allow productive activity in a hotel room, on an airplane, or simply in the comfort of one's own home. Individuals, however, are not the only members of society that are taking advantage of today's technology. Business units in virtually all fields of commerce have come to depend upon the advancement of technology to provide the edge that is required to keep them competitive.

A particular business entities' operations, for example, may require primarily static operational facilities, or conversely may require primarily dynamic operational facilities. Regardless of the nature of the business entities' operations, they will most likely depend upon advancements in technology to maintain their competitive edge. The operations of disaster relief organizations, for example, may be characterized as primarily dynamic, since the locale of a disaster relief organizations' operations may be the epicenter of a recent earthquake, or a flood zone left in the wake of a recent hurricane. Other primarily dynamic business operations may be exemplified by those of a local crime scene investigation (CSI) laboratory, whose primary activities include the collection and analysis of forensic evidence at a remote crime scene. Other primarily dynamic business operations may include those of news and movie industries, whereby collection of digital data is the primary objective during their respective operations.

Conversely, the characterization of a particular business entities' operation may be one that is primarily static. For example, telecommunication facilities are often provided all over the world to facilitate wireless and/or terrestrial based communications. Such installations often include switch equipment rooms that include a large number of electronic equipment racks that have been installed to provide both circuit switched, and packet switched, data exchange. Other forms of primarily static installations may include data migration centers, which offer large amounts of storage capability for a variety of applications that require data integrity.

It can be seen, therefore, that business operations conforming to either of the primarily static, or primarily dynamic, paradigm have occasion to provide electronic facilities that require at least some aspects of mobility. Primarily dynamic entities, for example, are often faced with the daunting task of mobilizing data computation and data storage facilities into an area that is not particularly conducive to such operations. A military unit, for example, may require temporary data storage and computational facilities at a site that is primarily characterized by extreme conditions, such as a desert or tropical environment. As such, the data computation/storage facilities required by the military unit are required to be mobile and operational in an environment that is particularly prone to at least one of high temperature, high humidity, and/or dust contamination. Furthermore, such an environment may not be particularly secure, nor topographically conducive, to the transportability of highly sensitive electronics.

Primarily static entities are also in need of mobile electronic facilities, since such facilities may be vulnerable to equipment failure, or simply may be in need of equipment upgrade. As such, a mobile electronic solution is needed to provide electronic equipment replacement, or augmentation, to fully support the replacement of failed electronics, or to augment the current capabilities of the electronic facility.

Traditional electronic mobility solutions, however, simply fail in many respects to meet the demands of today's electronic mobility requirements. While traditional mobile electronic solutions may attempt to address the mundane and relatively unimportant aspects of mobility, they simply fall short of the more critical aspects of electronic mobility, such as shock absorption, environmental control, security, power conditioning, wireless data access, etc. Efforts continue, therefore, to provide a substantially complete solution for today's mobile electronic equipment needs.

SUMMARY

To overcome limitations in the prior art, and to overcome other limitations that will become apparent upon reading and understanding the present specification, various embodiments of the present invention disclose an apparatus and method of providing electronic equipment rack mobility. Certain of the mobility characteristics may include directional self-propulsion, multi-axis suspension, biometric security, wireless data interfacing, on-board power conditioning, and environmental control.

In accordance with one embodiment of the invention, an electronic component transport system comprises a platform having first and second surfaces and a mobility control device that is coupled to the first surface of the platform and is adapted to provide directional propulsion of the platform. The electronic component transport system further comprises a first enclosure that is coupled to the second surface of the platform and a second enclosure that is coupled to the second surface of the platform and the first enclosure. The second enclosure is adapted to accept a plurality of electronic components. The electronic component transport system further comprises a suspension system that is coupled to the first and second enclosures and to the second surface of the platform and is adapted to isolate a position of the second enclosure from relative position variations of the platform and the first enclosure. The suspension system includes a first suspension device that is coupled to the second enclosure and the second surface of the platform. The first suspension device is adapted to maintain a position of the second enclosure between a minimum and a maximum distance in a first direction relative to the first enclosure. The suspension system includes a second suspension device that is coupled to the second enclosure and is adaptively programmed to dampen movement of the second enclosure between the minimum and the maximum distance relative to the first enclosure. The electronic component transport system further comprises a third enclosure encompassing the first and second enclosures. The third enclosure includes a power conditioner that is coupled to receive an input power signal and is adapted to provide a conditioned power signal to the plurality of electronic components in response to the input power signal. The third enclosure further includes an environment control unit that is adapted to maintain the plurality of electronic components at a substantially constant temperature.

In accordance with another embodiment of the invention, a mobile equipment rack assembly comprises a platform that is adapted to provide directional propulsion. The mobile equipment rack assembly further comprises a first rack that is coupled to the platform and a second rack that is coupled to the first rack and the platform, where the second rack is encapsulated by the first rack. The mobile equipment rack assembly further comprises a shock absorption unit that is coupled to the first and second racks. The shock absorption unit includes a weight bearing device that is coupled to the second rack and is adapted to maintain a position of the second rack within a first range of distance in a first direction relative to the first rack. The shock absorption unit further includes a dampening device that is coupled to the second rack. The dampening device is adaptively programmed to dampen movement of the second rack within the first range of distance.

In accordance with another embodiment of the invention, an equipment rack assembly comprises a first rack that is coupled to a platform, a second rack that is coupled to the first rack and the platform, and a shock absorption unit that is coupled to the first and second racks. The shock absorption unit includes a weight bearing device that is coupled to the second rack and the platform and is adapted to maintain a position of the second rack within a first range of distance relative to the first rack. The shock absorption unit further includes a dampening device that is coupled to the second rack and is adaptively programmed to dampen movement of the second rack within the first range of distance.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
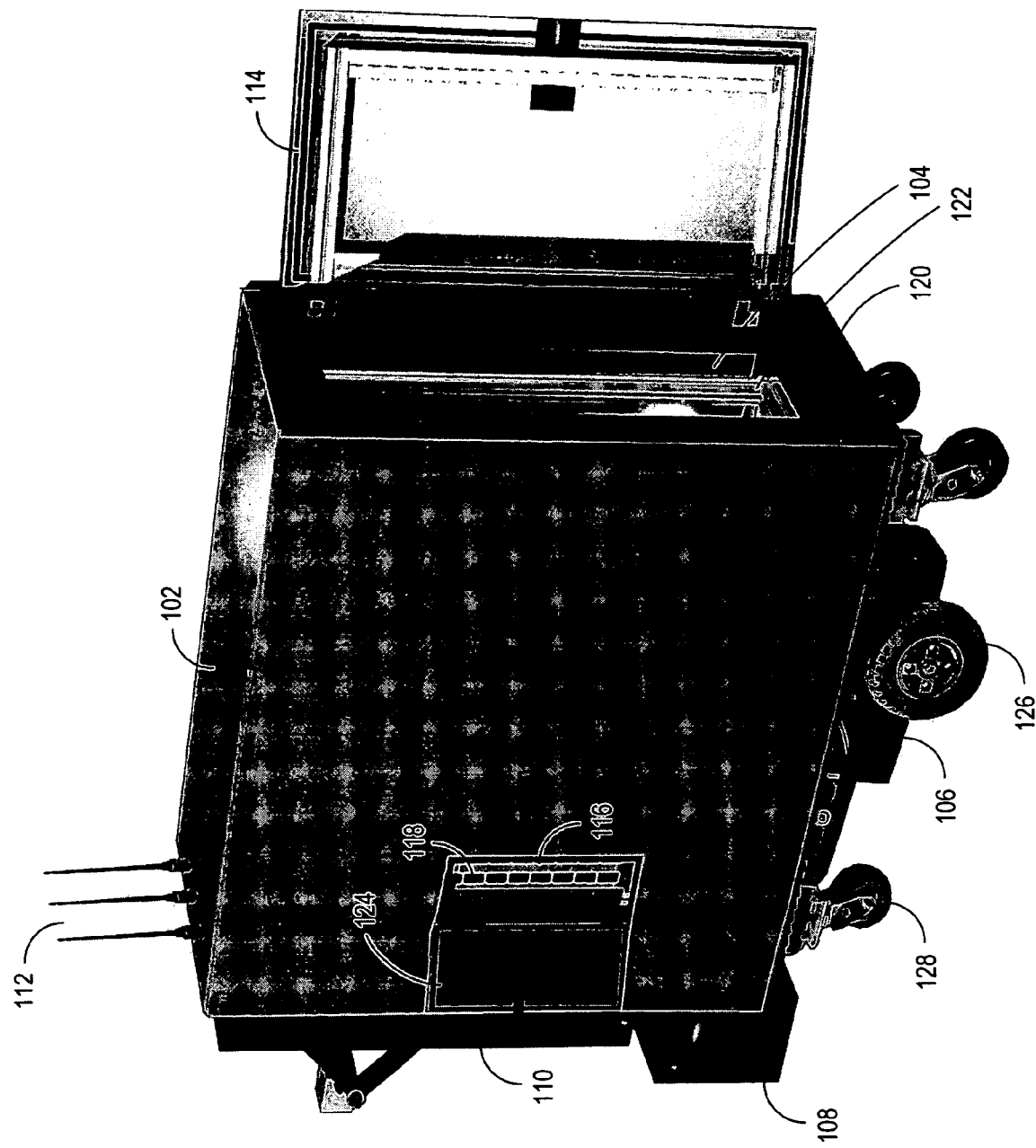
FIG. 1 illustrates an exemplary mobile electronic equipment rack.

Generally, the various embodiments of the present invention are applied to an electronic equipment rack that, inter alia, may provide mobility through directional self-propulsion and multi-axis suspension. The electronic equipment rack may further provide self-powered operation and environmental control with wireless access, while protecting against unauthorized access, electromagnetic interference, and dust contamination.

In one embodiment, for example, the mobile electronic equipment rack may utilize a two-sided platform, whereby support is provided for electronic components mounted on one side of the platform and directional propulsion is provided on the other side of the platform. Directional control may be provided via a wired, electronic tether, or conversely may be provided via wireless control.

Accordingly, the mobile electronic equipment rack may first be fully populated with electronic components and then utilized as a remotely piloted transport mechanism to transport the mobile electronic equipment rack to any position/ location that may be necessary for a given application. A multi-axis suspension system may be further employed within the mobile electronic equipment rack to substantially eliminate the transfer of kinetic energy to the electronic components that are contained within the mobile electronic equipment rack during positioning/re-location.

In an alternate embodiment, a non-mobile electronic equipment rack may be provided without directional self-propulsion. In this instance, a multi-axis suspension system is nevertheless employed so that kinetic energy resulting from, for example, seismic events may be substantially absorbed. Non-mobile electronic equipment racks in non-stable environments, such as on water based vessels or off-shore oil dereks, may also be equipped with a multi-axis suspension system so as to substantially absorb wave induced kinetic energy.

Other, non-mobile electronic equipment rack applications may include airborne applications, whereby kinetic energy transfers due to atmospheric turbulence may also be substantially eliminated. Still other non-mobile electronic equipment rack applications may include motor vehicle based applications, whereby kinetic energy transfers due to non-ideal road conditions may also be substantially eliminated.

In either of the mobile, or non-mobile, electronic equipment rack embodiments, a dual mode, dampened suspension system is utilized. In the first mode of suspension, coarse suspension control is provided to effect a weigh bearing support, whereby the magnitude of support provided adapts to the combined weight of the electronic components and their respective mounting enclosure. For example, as electronic components are added, the coarse suspension control adapts by increasing the amount of opposing force that is necessary to maintain the position of the electronic components within a coarse position range. Conversely, as electronic components are removed, the coarse suspension control adapts by decreasing the amount of opposing force that is necessary to maintain the position of the electronic components within the coarse position range.

In a second mode of suspension, fine suspension control is provided through a damper mechanism, which opposes movement and seeks to maintain a position of the payload within a fine position range. In a first embodiment, a static, magnetorheologically (MR) controlled damper force may be applied to effect static dampening. In particular, a statically controlled MR damper signal is provided to the damper mechanism to provide a fixed amount of damper force to maintain the mounting enclosure within a fine position range.

In an alternate embodiment, the damper force may be adaptive, such that the magnitude of the damper force is set in response to an adaptive, MR feedback control signal from, for example, a micro-electro mechanical system (MEMS) accelerometer measurement device. As such, the damper force may be adaptively increased in response to accelerometer feedback indicating increased acceleration. Conversely, the damper force may be adaptively decreased in response to accelerometer feedback indicating decreased acceleration.

Once the electronic equipment rack arrives at its designated position/location, or conversely is operated in a non-mobile application as discussed above, power may be applied to the electronic equipment rack via an external power bus, so that each electronic component within the electronic equipment rack may be made to be fully operational. Operational power is typically applied in an alternating current (AC) mode, which in one embodiment, may necessitate conversion to a direct current (DC) mode prior to application to the electronic components.

In other embodiments, however, AC power may be directly applied to the electronic components once the AC power has been appropriately conditioned. Power conditioning, for example, may be applied to the incoming AC power signal, to filter electro-magnetic interference (EMI), or any other form of noise, from the incoming AC power signal. The power conditioner may also utilize an isolation transformer to isolate the electronic components from power surges existing within an AC power signal received, for example, from a common power grid. Once conditioned, the AC power may then be applied to an internal power bus within the electronic equipment rack for consumption by the electronic components.

In such instances, for example, operation of the electronic components within the electronic equipment rack may be compatible (e.g., through operation of the power conditioner) with AC power grids operating at a plurality of amplitudes, e.g., 110 VAC or 220 VAC, and a plurality of frequencies, e.g., 50 Hz or 60 Hz. In an alternate embodiment, the power conditioner may also be utilized in aviation applications, where the power grid may be operating at a DC potential of 28 VDC, or conversely, 115/230 VAC at 400 Hz or 480 Hz.

Additionally, any noise that may be propagated from the electronic components to the internal power bus may also be filtered by the power conditioner, so that other equipment operating from the common power grid may be substantially free of noise contamination that may be generated by the electronic components. Furthermore, the electronic equipment rack may be fully encapsulated within an environment proof enclosure, which may be lined with an EMI protective shield so as to limit the amount of EMI propagating into, or from, the electronic equipment rack.

The environment proof enclosure may also serve to maintain the electronic equipment rack within a substantially constant operational temperature range. In such an instance, the temperature within the environment proof enclosure is held substantially constant irrespective of the temperature variation outside of the environment proof enclosure and irrespective of the amount of heat generated by the electronic components operating within the electronic equipment rack.

In one embodiment, a heating, ventilation, and air conditioning (HVAC) unit may be mounted on any side of the environment proof enclosure. An internal channel, or ducting system, may be utilized to direct heat exchanged, i.e., cooled, airflow from the HVAC unit toward the opposite end of the electronic equipment rack. The cooled air is then allowed to flow upward, so that the electronic components operating within the electronic equipment rack may draw the cooled air into their respective interiors for cooling.

Once the air conditioned air is drawn into the individual electronic component interiors, heat is exchanged from the individual electronic components to the cooled airflow to effectively maintain the electronic components operational within their respective temperature limits. The heated air may then be vented from the individual electronic components and collected at the other end of the electronic equipment rack for cooling by the HVAC unit.

In addition to maintaining air temperature within the environment proof enclosure, humidity may also be controlled by the HVAC unit through appropriate humidification control via, e.g., mechanical refrigeration or desiccant-based dehumidification. Thus, the HVAC implemented humidity control may correct for excessively high humidity, so that corrosion of electrical contacts within the environment proof enclosure is virtually eliminated. Conversely, the HVAC implemented humidity control may also correct for excessively low humidity, so that electrostatic discharge effects (ESD) may be mitigated.

Since the environmental control system is a closed loop system, dust control is inherently implemented within the environment proof enclosure. That is to say, for example, that heat is exchanged without introduction of external air into the environment proof enclosure. As such, not only is dust prevented from entering the environment proof enclosure, but any dust that may be trapped within the environment proof enclosure prior to sealing, is immediately captured by an internal dust filter during circulation of the heat exchanged airflow from the HVAC unit.

Data egress from the environment proof enclosure and data ingress to the environment proof enclosure may be accomplished, for example, via a multiple-in, multiple-out (MIMO) wireless interface. In particular, multiple antennas may be used to provide a diverse, wireless access point (WAP), whereby multipath signals may each be received and coherently combined for added signal strength. As such, the range of access and data rate may be considerably increased as compared, for example, to the IEEE 802.11a, 802.11b, and 802.11g family of wireless communication specifications.

Data egress and ingress to the environment proof enclosure may also be accomplished via a keyboard, video, mouse (KVM) wireless switch. The KVM wireless switch may be used, for example, to allow access to network management and control features that may be provided by the electronic components hosted within the environment proof enclosure. It should be noted, that both the MIMO and KVM interfaces allow access to the electronic components, while the electronic components are operational within the environment proof enclosure. An alternate, wired interface may also be used in addition to, or instead of, the KVM and/or MIMO wireless interfaces for essentially the same purposes.

Security and safety features may also be incorporated within the electronic equipment rack, so that unauthorized access to the data storage, computational resources, or any other application of the electronic components, may be prohibited. Other security features may employ a multi-user/multi-function access control to allow permission for specific users to perform specific functions. For example, specific users may be individually authorized to mobilize and/or energize the mobile electronic equipment rack. Specific users may also be individually authorized to access the mobile electronic equipment rack via electronically controlled access hatches should it be encapsulated within an environment proof enclosure.

Turning to FIG. 1, an exemplary embodiment of a mobile electronic equipment rack is illustrated. Directional self-propulsion may be facilitated by mobility control device 106, which may be mounted to a bottom surface of platform 120. Mobility control device 106 may be electro-mechanically controlled via, for example, a DC drive motor (not shown), to convert mobility control signals into directional propulsion to maneuver the mobile electronic equipment rack into its designated position/location.

Mobility control signals may be provided to mobility control device 106 through a wireless, or wired, medium. Wired access, for example, may be supplied via a tether control mechanism (not shown) that may be attached via patch panel 116, or some other interface. One of input/output (I/O) interface connectors 118, for example, may facilitate exchange of mobility control signals to/from mobility control device 106.

A wide variety of mobility control information may be accepted by mobility control device 106 to control such mobility aspects as velocity, direction, and acceleration/deceleration. A center wheel drive, for example, may be utilized to receive directional control signals to provide 360 degree maneuverability of the mobile electronic equipment rack via drive wheels 126. In particular, drive wheel 126 and the opposing drive wheel (not shown) are independently activated via an articulated transaxle drive, which facilitates a 0 degree turn radius. Casters 128 are also provided for stability, both during transport, as well as during stationary operation. As discussed in more detail below, user's wishing to maneuver the mobile electronic equipment rack via mobility control device 106 may first be required to authenticate themselves through security control features implemented within the mobile electronic equipment rack.

Operational power may be supplied to mobility control device 106 via DC batteries (not shown). As discussed above, power conditioner 108 may receive any one of a variety of DC and/or AC input power signals. If DC is supplied, for example, then the DC power may be directly applied, or regulated and then applied, to recharge the DC batteries (not shown), which are responsible for delivering current to activate the transaxle drive (not shown) of mobility control device 106. Alternately, AC power may be accepted by power conditioner 108 and subsequently rectified to produce the DC power levels required to recharge the DC batteries (not shown).

Environment proof enclosure 102 may be utilized to maintain interior compartment 104 of the mobile electronic equipment rack within a range of controlled environment specifications. For example, once electronic components are installed within mounting enclosure 122, access hatch 114 may then be closed to seal the electronic components within a temperature controlled, substantially dust free environment. Furthermore, EMI shielding may be installed along the inner surfaces of environment proof enclosure 102, or conversely environment proof enclosure 102 may be manufactured from EMI shielding material, such as fiberglass-reinforced foil, to substantially eliminate EMI ingress/egress. Still further, noise filtering may also be employed within power conditioner 108, as well as patch panel 116, to substantially eliminate conduction of noise onto the power and control buses (not shown) within interior compartment 104.

It should be noted, that environment proof enclosure 102 may also provide protection against ballistic projectiles by appropriately designing the walls of environment proof enclosure 102. For example, the walls of environment proof enclosure 102 may be implemented with armored materials such as fiberglass, or other composites, such as carbon fiber, ceramic, Kevlar®, etc.

Access to interior compartment 104 may be provided by any one of a number of access hatches, such as access hatch 114. As discussed above, authentication of authority to activate access hatch 114 may first be required as a security measure. Access hatch 124 may be similarly provided to allow access to patch panel 116. Access to either of access hatches 114 or 124 may be authorized/unauthorized by the disengagement/engagement of a locking mechanism (not shown), the authorization of which is predicated upon successful authentication of the particular user who is requesting access.

Various security mechanisms may be employed to authenticate users prior to allowing access to interior compartment 104 and/or patch panel 118. A wireless KVM switch (not shown) mounted within interior compartment 104, for example, may receive a wireless authentication request from a user. In one embodiment, the wireless KVM switch may receive biometric information that is associated with the user, such as a scan of his or her fingerprint, in order to authenticate the user's access. Biometric authentication may also include techniques for measuring and analyzing other physical and behavioral characteristics of a user. Examples of physical characteristics that may be used for physical authentication are eye retina scans, facial patterns, and hand measurements. Alternatively, behavioral characteristics such as signature, gait and typing patterns may also be used for biometric authentication. Hybrid characteristics that share both physical and behavioral characteristics, such as voice, may also be used for biometric authentication.

In an alternate embodiment, authentication may instead be initiated through activation of a security device, such as a universal serial bus (USB) based flash drive that may insert into an authentication verification device (not shown). The authentication verification device may be mounted externally to environment proof enclosure 102 to allow insertion of a security device, such as the USB based flash drive. In an alternate embodiment, a biometric scanner (not shown) may be installed within the authentication device (not shown) to obviate the need to use the wireless KVM switch, or other security device, for user authentication. Other embodiments may provide wireless authentication through the use of radio frequency identification (RFID), Bluetooth access control, inductive proximity sensors, etc.

As discussed above, environment control unit 110 may be utilized to maintain interior compartment 104 within a predetermined temperature and humidity range. In one embodiment, environment control unit 110 may be implemented as an HVAC unit operating within a closed circuit consisting of, for example, a compressor, an expansion valve, and two heat exchangers, e.g., an evaporator and a condenser. A volatile liquid, such as a refrigerant, circulates through the four components and is delivered to the compressor after having absorbed heat from interior compartment 104. The refrigerant exits the compressor as a hot vapor, where it is then condensed into a warm liquid. A flow control valve regulates the flow of the refrigerant, allowing it to expand into a cold liquid before returning to interior compartment 104 to complete the cycle. Air, having been cooled by the cold liquid, is then circulated via a ducted channel for optimal cooling of the electronic components mounted within interior compartment 104.

Environment control unit 110 may itself be mounted onto a hinged access hatch that is similar to access hatch 114. As such, authenticated egress/ingress may be allowed from/to interior compartment 104 at the opposite end of access hatch 114 to facilitate access to the rear end of electronic components mounted to mounting enclosure 122. It should be noted, that environment control unit 110 may also be installed on any other side of environment proof enclosure 102 as may be required by a particular implementation. For example, the size and weight of environment control unit 110 may require that it be mounted on top of environment proof enclosure 102 in order to provide optimal weight distribution for improved stability.

Operation of electronic components mounted to mounting enclosure 122 are intended to be operated while all access hatches are secured. Given that patch panel 116 is implemented with water resistant connectors and attachments, however, it is understood that hatch 124 may remain open while the electronic equipment rack of FIG. 1 is operational, even while operating in an environment susceptible to atmospheric precipitation.

As discussed above, the operational power applied to power conditioner 108 may be derived from AC power grids operating at a plurality of amplitudes, e.g., 110 VAC or 220 VAC, and a plurality of frequencies, e.g., 50 Hz or 60 Hz. In alternative embodiments, power conditioner 108 may also be utilized in aviation applications, where the power grid may be operating at a DC potential of 28 VDC, or conversely, 115/230 VAC operating at 400 Hz or 480 Hz.

In any event, once the electronic components are operational, access to their respective I/O ports may be provided in one of two formats. First, MIMO wireless access point (WAP) 112, for example, may be used to access the data/computational resources of the electronic components. MIMO WAP 112 implements two or more antennas to send and receive information using, for example, orthogonal frequency division multiplexing (OFDM) to significantly increase the data throughput as compared to conventional wireless access technologies.

A MIMO router may be used in conjunction with MIMO WAP 112 to provide/retrieve information to/from the electronic components that are mounted to mounting enclosure 122. The MIMO router may support the standard Wired Equivalent Privacy (WEP) and/or the advanced Wi-Fi Protected Access (WPA) for data encryption. Additional security features may also include Media Access Control (MAC) and Internet Protocol (IP) filtering for limiting network access based on MAC Address or IP Address.

Wired access to the data/computational resources of the electronic components of the mobile electronic equipment rack may also be implemented via water resistant patch panel 116. Connectors 118 may represent a wide variety of data I/O connectors, such as for example, category 5 and/or 6 connectors, as may be used to support Gigabit Ethernet applications. Fiber optic communications may also be supported by patch panel 116 in support of, for example, a synchronous optical network (SONET) ring. It is appreciated that any number of I/O connectivity options, such as radio frequency (RF) connectors, may also be provided by patch panel 116.

In operation, the mobile electronic equipment rack of FIG. 1 may include its use as a mobile, high-density server, such as a blade server. In particular, mounting enclosure 122 may be adapted to mount a plurality of blade server chassis, where each chassis may include a plurality of modular electronic circuit boards known as server blades. Each server blade contains one or more microprocessors, memory, and other electronics, and is generally intended for a specific application. The server blades may also provide integrated network controllers, a fiber optic host bus adaptor (HBA), and other I/O ports to facilitate data exchange.

Each server blade may also include an advanced technology attachment (ATA) or small computer system interface (SCSI) disk drive. For additional storage, the blade servers may connect to a storage pool (via, for example, the MIMO or patch panel interface), where the storage pool is facilitated by a network attached storage (NAS), fiber channel, or Internet SCSI (iSCSI) storage area network (SAN). Blade servers mounted within the mobile electronic equipment rack of FIG. 1 is effective to consolidate several blade servers into a single chassis and also consolidates associated resources, such as storage and networking equipment, into a smaller architecture that can be managed through a single interface, e.g., the MIMO or patch panel interface, as discussed above.

Furthermore, multiple blade server chassis may be mounted and configured for operation before mobilization. In such an instance, pre-configured blade servers may be mobilized in a completely secure environment, protected from vibration induced damage during transportation, and quickly energized within a temperature and humidity controlled environment virtually anywhere in the world. In addition, the blade server network may be quickly relocated in a safe, orderly, and efficient manner as may be required by many government and/or commercial applications.

One such commercial application, for example, includes use as a storage medium for digitized audio, graphical, and video information in support of media, television, and motion picture operations. In particular, as new standards are developed for digital technologies in audio, still pictures, motion pictures, and television, digital storage solutions become increasingly necessary. As such, the mobile equipment rack of FIG. 1 may be populated with blade servers and deployed to support digital video and audio storage at various stages of digital data operations, e.g., acquisition, production, control-room editing, transmission, and reception.

Thus, the mobile equipment rack of FIG. 1 may be effectively deployed as a mobile video storage server, such that when fully configured with blade servers as discussed above, may provide, for example, up to 57 terabytes of video/audio digital storage capability. As such, wireless camera feeds to the MIMO WAP 112 of the video storage server may be implemented during, for example, on-location filming to facilitate direct digital storage of several days, or even several weeks, of direct digital audio/video recordings.

Once its storage capacity has been reached, the mobile video storage server may be relocated to a main control room, whereby direct editing of the digital content may be achieved. Conversely, the mobile video storage server may remain deployed on-location to support editing/playback operations at the actual filming site, whereby editing/playback operations may be facilitated through digital data access via either of MIMO WAP 112 or wired patch panel 116.

It should be noted, that the mobile electronic equipment rack of FIG. 1 may be implemented with low-profile suspension, as discussed in more detail below, which provides for a reduced height. Furthermore, the width of the mobile electronic equipment rack of FIG. 1 allows entry into most standard sized doorways. In one embodiment, for example, physical dimensions of the mobile electronic equipment rack of FIG. 1 provide approximately 58" in height, 27" in width, and 54" in length. Thus, access to the interiors of most standard buildings is facilitated by the relatively small profile dimensions of the mobile electronic equipment rack of FIG. 1, which enhances the versatility provided to its commercial, industrial, and governmental users.

Figure 2:
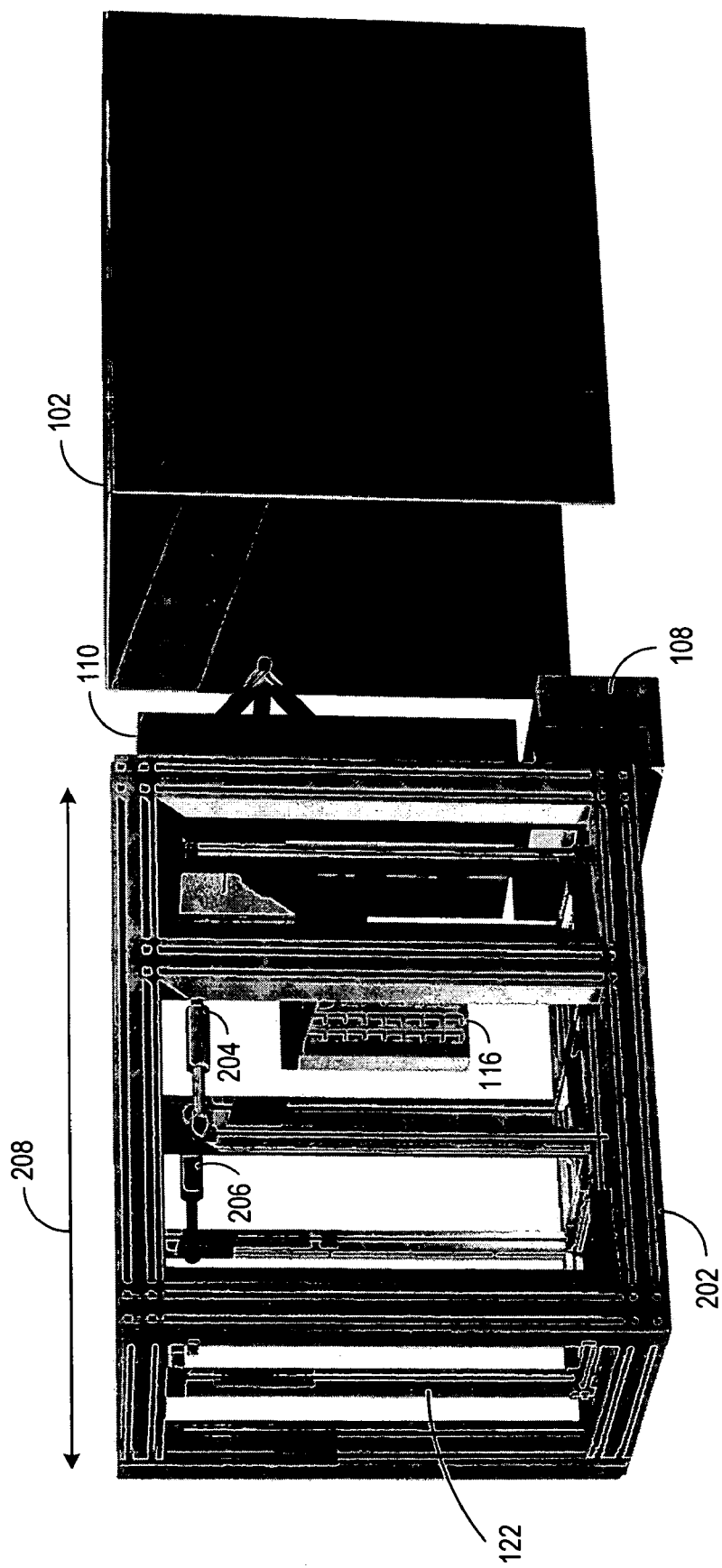
FIG. 2 illustrates an exploded view of the mobile electronic equipment rack of FIG. 1.

Turning to FIG. 2, an exploded view of the various enclosures are illustrated, whereby a portion of environment proof enclosure 102 is pulled away to reveal mounting enclosure 122 and structural enclosure 202. Also exemplified, is the rear view of patch panel 116 as well as a side view of environment control unit 110 and power conditioner 108.

As can be seen by inspection, mounting enclosure 122 is enclosed within structural enclosure 202. Both mounting enclosure 122 and structural enclosure 202 are composed of an anodized metal, such as aluminum or steel, and are tig welded for strength. As discussed in more detail below, mounting enclosure 122 "floats" within the spatial confines as defined by structural enclosure 202 through the use of a multi-axis suspension system. That is to say, for example, that at least two modes of support are used to create a multi-axis, variable weight, magnetorheological isolation system, which seeks to maintain mounting enclosure 122, and electronic components (not shown) mounted therein, substantially isolated from kinetic energy transfer.

Structural enclosure 202 is "hard" mounted to platform 120 (not shown in FIG. 2), while mounting enclosure 122 is "soft" mounted to both platform 120 (not shown in FIG. 2) and structural enclosure 202. As such, kinetic energy may be directly transferred to structural enclosure 202 during transportation, or other acceleration generation events, due to the "hard" mounting relationship between platform 120 and structural enclosure 202. In contrast, however, substantially all of the kinetic energy that may be transferred to structural enclosure 202 along a longitudinal component as defined by directional vector 208 is virtually absorbed by MR supports 204 and 206.

MR supports 204 and 206 represent a first mode of "soft" support, whereby relative motion between mounting enclosure 122 and supporting enclosure 202 is dampened by operation of MR supports 204 and 206. A first end of MR supports 204 and 206 are coupled to an outer portion of mounting enclosure 122 as illustrated, while a second end of MR supports 204 and 206 are coupled to an inner portion of structural enclosure 202 as illustrated. The coupling between the outer portion of mounting enclosure 122 and the inner portion of structural enclosure 202 is said to be "soft", since substantially all of the kinetic energy that is transferred by the relative motion between mounting enclosure 122 and supporting enclosure 202 is dampened by operation of MR supports 204 and 206.

MR supports 204 and 206 utilize an MR fluid, whereby a viscosity change in the MR fluid is effected in the presence of a magnetic field to increase/decrease the dampening effects of MR supports 204 and 206. In particular, a control unit (not shown) transmits a pulse width modulated (PWM) signal to a magnetic coil that surrounds the MR fluid contained within a monotube housing of MR supports 204 and 206. The PWM signal parameters, such as duty cycle, may be predetermined through the use of a potentiometer (not shown) and may be preset to a predetermined value by an appropriate voltage as selected by the potentiometer.

By increasing the duty cycle of the PWM signal through forward potentiometer control, for example, the control unit imparts an increased magnitude of time varying current to the magnetic coil, which in turn imparts an increased magnetic field around the MR fluid. In response, the damper forces exerted by MR supports 204 and 206 increase proportionally. Conversely, by decreasing the duty cycle of the PWM signal through reverse potentiometer control, the control unit imparts a decreased magnitude of time varying current to the magnetic coil, which in turn imparts a decreased magnetic field around the MR fluid. In response, the damper forces exerted by MR supports 204 and 206 decrease proportionally.

Figure 3:
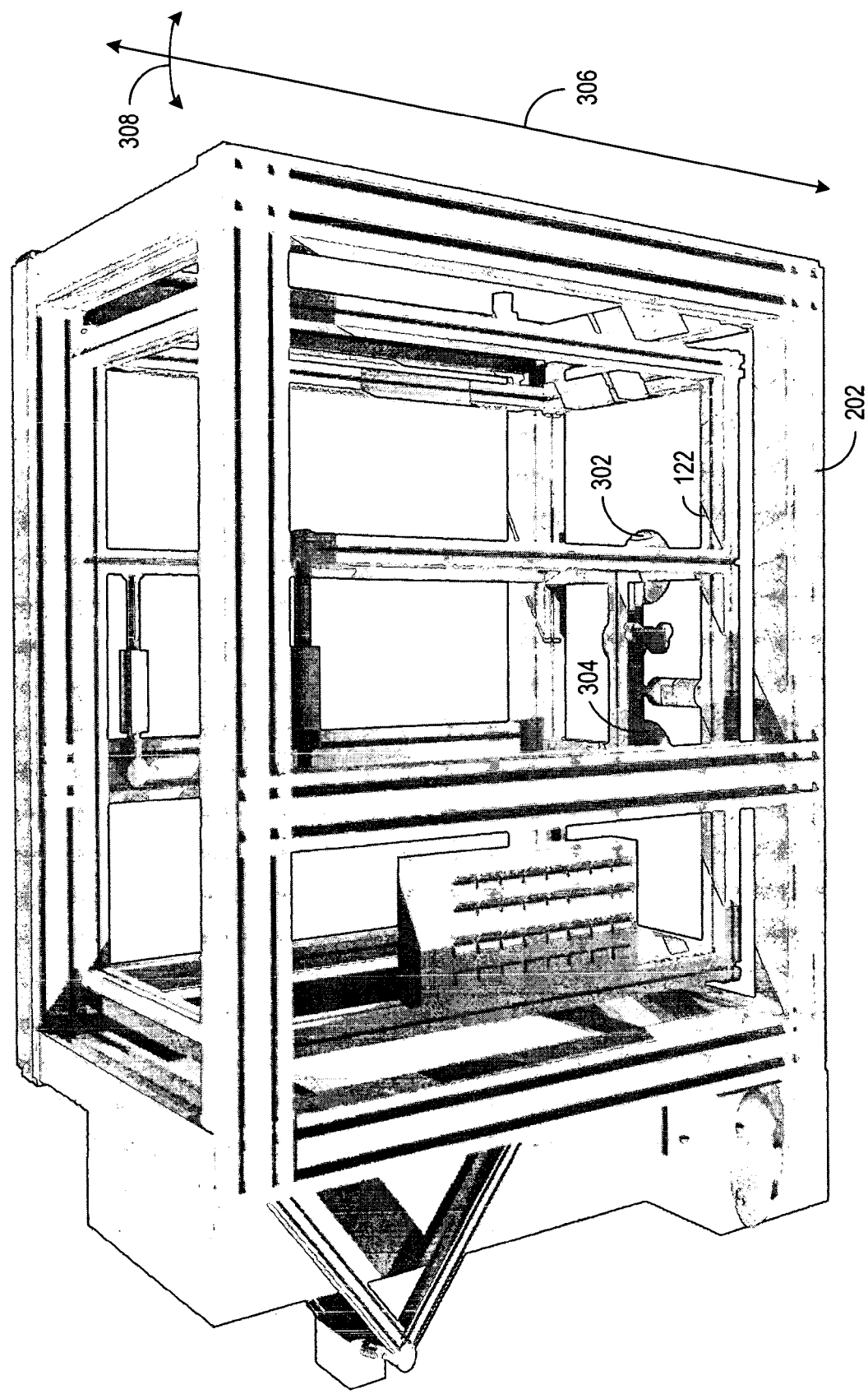
FIG. 3 illustrates illustrated an alternate view of the mobile electronic equipment rack of FIG. 1.

Turning to FIG. 3, a vertical component of isolation is illustrated along directional vector 306. In particular, support components 302 and 304 are "soft" coupled to the bottom side of mounting enclosure 122 and platform 120 (not shown), such that support is provided to mounting enclosure 122, and each electronic component (not shown) mounted therein, in direct proportion to the weight of the combined mounting enclosure 122 and electronic component payload. That is to say, that support components 302 and 304 provide weight adaptive support along the vertical directional vector 306 in order to maintain a substantially fixed position of mounting enclosure 122 that is virtually independent of the combined weight of mounting enclosure 122 and associated payload.

Furthermore, support components 302 and 304 provide flexibility along longitudinal axis 308, in order to account for any weight discrepancies that exist along longitudinal axis 308. For example, electronic components may be mounted within mounting enclosure 122, such that more weight is transferred to support component 302 as compared to the amount of weight that is transferred to support component 304. In this instance, the amount of weight bearing support that is provided by support component 302 is greater than the weight bearing support that is provided by support component 304.

Conversely, electronic components may be mounted within mounting enclosure 122, such that more weight is transferred to support component 304 as compared to the amount of weight that is transferred to support component 302. In this instance, the amount of weight bearing support that is provided by support component 304 is greater than the weight bearing support that is provided by support component 302. Thus, in either instance, the amount of weight bearing support that is provided by supports 302 and 304 is weight adaptive in order to maintain mounting enclosure 122 in a relatively level attitude irrespective of the relative positions of platform 120 (not shown) and/or support enclosure 202.

It should be noted, that supports 302 and 304 provide an additional degree of freedom along an axial component as defined by directional vector 308. In particular, supports 302 and 304 provide a degree of freedom to allow operation of MR supports 204 and 206 as discussed above in relation to FIG. 2. Thus, supports 302, 304, 204, and 206 interoperate within a two-dimensional range of movement to provide suspension along axial components defined by directional vectors 306 and 308.

A third dimension of suspension along an axial component that is orthogonal to both directional vectors 308 and 306 may be provided to substantially isolate mounting enclosure 122 from lateral acceleration forces. In such an instance, dampening MR supports, such as those utilized for MR supports 204 and 206, may be coupled between mounting enclosure 122 and support enclosure 202, in a perpendicular arrangement with respect to MR supports 204 and 206, to provide dampened suspension along a lateral axis that is perpendicular to longitudinal vector component 308 and vertical vector component 306.

In one embodiment, support components 302 and 304 may include a pneumatic shock absorption device, whereby a deflection of mounting enclosure 122, due to the addition or subtraction of weight, may be sensed and corrected. Magnetic sensors (not shown), for example, may be mounted to both mounting enclosure 122 and support enclosure 202 to detect a change in position of mounting enclosure 122 relative to support enclosure 202 along directional vector 306. In such an instance, feedback provided by the magnetic sensors (not shown) may be provided to a compressor (not shown) to inflate/deflate pneumatic support components 302 and 304 so that the axial position of mounting enclosure 122 relative to support enclosure 202 along directional vector 306 is maintained within a predetermined stroke range.

Figure 4:
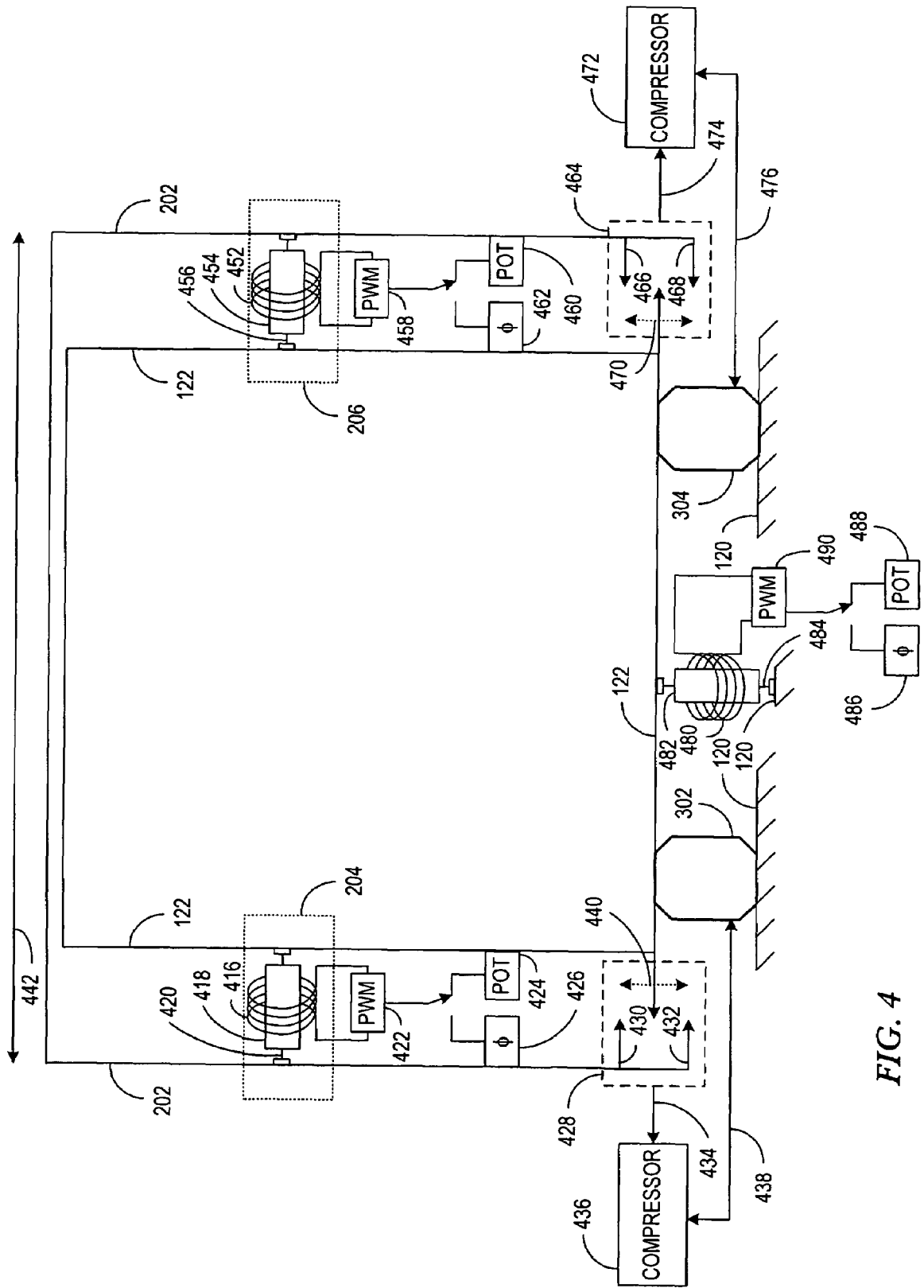
FIG. 4 illustrates an exemplary schematic diagram of a multi-axis suspension system.

Turning to FIG. 4, an exemplary functional schematic diagram of one embodiment of a multi-axis suspension system is illustrated. It should be noted, that orientation of components in FIG. 4 do not necessarily denote their spatial configuration, but rather represent their functional relationship with respect to one another. Explanation of the operation of the multi-axis suspension system of FIG. 4 is facilitated in view of FIGS.

1-3. Pneumatic support components 302 and 304 are coupled between platform 120 and the bottom portion of mounting enclosure 122 to provide a vertical component of support along directional vectors 440 and 470, while also providing flexibility of movement along longitudinal axis 442.

Position detectors 428 and 464 utilize, for example, magnetic sensors 430,432 and 466,468 to maintain mounting enclosure 122 within a range of movement illustrated by vertical directional vectors 440 and 470. In particular, position signals 434 and 474 provide an indication to a control unit (not shown) associated with compressors 436 and 472, respectively, as to the position of mounting enclosure 122 relative to support enclosure 202. If the position of mounting enclosure 122 is centered between sensors 430 and 432, for example, then pneumatic support 302 is considered to be in an equilibrium position and no further action is taken. Similarly, if the position of mounting enclosure 122 is centered between sensors 466 and 468, for example, then pneumatic support 304 is considered to be in an equilibrium position and no further action is taken.

If, however, the position of mounting enclosure 122 indicates a position 440 that is below equilibrium, then position signal 434 provides the requisite indication to the control unit (not shown) associated with compressor 436 to correct the over-weight condition. In particular, position signal 434 causes compressor 436 to inflate pneumatic support 302, i.e., increase pressure, via line 438 until pneumatic support 302 is inflated to the equilibrium position. Similarly, if the position of mounting enclosure 122 indicates a position 470 that is below equilibrium, then position signal 474 provides the requisite indication to the control unit (not shown) associated with compressor 472 to correct the over-weight condition. In particular, position signal 474 causes compressor 472 to inflate pneumatic support 304, i.e., increase pressure, via line 476 until pneumatic support 304 is inflated to the equilibrium position.

If, on the other hand, the position of mounting enclosure 122 indicates a position 440 that is above equilibrium, then position signal 434 provides the requisite indication to compressor 436 to correct the under-weight condition. In particular, position signal 434 causes the control unit (not shown) associated with compressor 436 to deflate pneumatic support 302, i.e., decrease pressure, via line 438 until pneumatic support 302 is deflated to the equilibrium position. Similarly, if the position of mounting enclosure 122 indicates a position 470 that is above equilibrium, then position signal 474 provides the requisite indication to the control unit (not shown) associated with compressor 472 to correct the under-weight condition. In particular, position signal 474 causes compressor 472 to deflate pneumatic support 304, i.e., decrease pressure, via line 476 until pneumatic support 304 is deflated to an equilibrium position.

It should be noted, that pneumatic supports 302 and 304 may operate independently of one another. That is to say, for example, that the extent of inflation/deflation of pneumatic supports 302 and 304 may be unequal, so that unequal weight distribution of mounting enclosure 122 and its associated payload (not shown) along longitudinal axis 442 may nevertheless be equalized. Thus, irregardless of the weight distribution, the position of mounting enclosure 122 may be substantially leveled with respect to support enclosure 202 and/or platform 120 to implement a first mode, or coarse, suspension control.

Acting in conjunction with pneumatic supports 302 and 304, is the second mode, or fine, suspension control. Fine suspension along directional vectors 440 and 470 is implemented by, for example, an MR support as exemplified by components 480-484 and MR damper control components 486-490. It should be noted, that the MR support as exemplified by components 480-484 actuate along a vertical axis that is aligned with directional vectors 440 and 470. That is to say, for example, that piston 484 extends and retracts through a stroke of motion that is substantially parallel with directional vectors 440 and 470.

In operation, piston 484 extends and retracts through its stroke of motion, while being subjected to a variable damper force. In particular, monotube housing 482 is filled with an MR fluid and is surrounded by magnetic coil 480. The magnetic field created by magnetic coil 480 causes a viscosity change in the MR fluid to exert a programmable range of damper forces on piston 484, where the viscosity changes in the MR fluid are effected by applying a variable magnitude of AC current to magnetic coil 480.

In operation, PWM 490 may receive either a primarily static, or a primarily dynamic, control signal from one of two PWM control sources. In a first embodiment, PWM 490 receives a primarily static control signal from potentiometer 488, which is then used to statically program a PWM signal having a duty cycle that is proportional to the statically programmed control signal from potentiometer 488. If low damper force is required, for example, then the appropriate control signal from potentiometer 488 may be statically programmed to produce a relatively low duty cycle, PWM signal. In response, a relatively low magnitude of AC current is imparted to magnetic coil 480, which in turn imparts a relatively low magnitude magnetic field around monotube housing 482. Accordingly, the MR fluid contained within monotube housing 482 reactively assumes a relatively low viscosity, which in turn provides a relatively low damper force to oppose the movement of piston 484.

If a relatively greater damper force is required, on the other hand, then the appropriate control signal from potentiometer 488 may be statically programmed to cause PWM 490 to transmit a relatively high duty cycle, PWM signal. In response, a relatively high magnitude of AC current is imparted to magnetic coil 480, which in turn imparts a relatively high magnitude magnetic field around monotube housing 482. Accordingly, the MR fluid contained within monotube housing 482 reactively assumes a relatively high viscosity, which in turn provides a relatively high damper force opposing the movement of piston 484.

In an alternate embodiment, a primarily dynamic control signal is provided to PWM 490, to effect an adaptively programmed mode of suspension, which is effective to isolate mounting enclosure 406 and its associated payload (not shown) from low frequency vibration operating in the range of a few cycles per second to several thousand cycles per second. In operation, accelerometer 486 measures acceleration forces along directional vectors 440 and 470 and provides an adaptive control signal to PWM 490 that is indicative of the acceleration forces measured. A low magnitude of instantaneous acceleration force may result in an adaptively programmed low duty cycle PWM signal, whereas a high magnitude of instantaneous acceleration force may result in an adaptively programmed high duty cycle PWM signal. Thus, acceleration forces across a wide vibration bandwidth may be adaptively dampened through the adaptive feedback provided by accelerometer 486 to PWM 490. The viscosity of the MR fluid then reacts to the corresponding changes in the magnetic field to exert proportional damper forces on piston 484 as discussed above.

It can be seen, therefore, that pneumatic supports 302 and 304 combine with MR support functions associated with components 480-490 to provide coarse and fine suspension control. Coarse suspension control is provided by pneumatic supports 302 and 304 to provide weight management of mounting enclosure 122 and its associated payload (not shown). Once the position of mounting enclosure 122 has been substantially equalized with respect to support enclosure 202 and/or platform 120, then fine suspension control is implemented via components 480-490 to "fine tune" the position in either of a programmably static, or adaptive, fashion.

MR supports may also be used to isolate kinetic energy from being transferred to mounting enclosure 122 and its associated payload (not shown) along a longitudinal axis depicted by directional vector 442. In particular, components 416-426 may combine to form MR support 204 of FIG. 2 to implement either programmably static or adaptive isolation from kinetic energy along directional vector 442. Additionally, components 452-462 may combine to form MR support 206 of FIG. 2 to implement either programmably static or adaptive isolation from kinetic energy along directional vector 442. Operation of components 416-426 and components 452-462 operate substantially as discussed above in relation to components 480-490 in either of a programmably static, or adaptive, fashion.

A third component of suspension may also be provided for mounting enclosure 122 and it associated payload (not shown). In particular, a component of suspension may be provided along a directional vector that is orthogonal to directional vectors 440, 470, and 442. The suspension, for example, may also be provided via MR supports, as discussed above, to provide a third axis of suspension to substantially eliminate kinetic energy transfer along a lateral axis relative to mounting enclosure 122.

Figure 5:
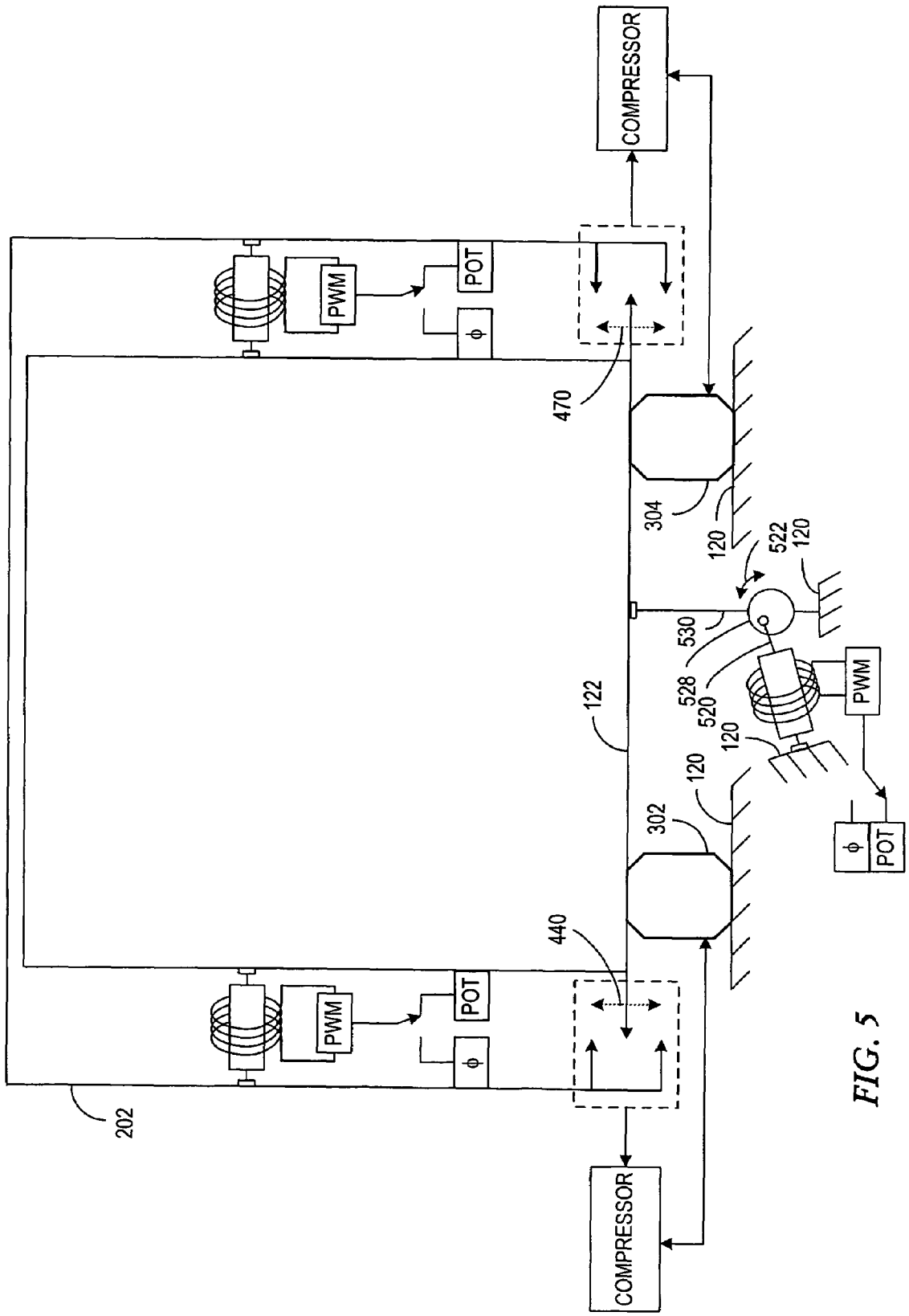
FIG. 5 illustrates an exemplary schematic diagram of an alternate, multi-axis suspension system.

Turning to FIG. 5, an alternate embodiment is exemplified in which a vertical component of suspension along directional vectors 440 and 470 is provided in a space saving fashion. In particular, the vertical component of suspension is provided in a manner that minimizes the amount of vertical space required between mounting enclosure 122 and platform 120.

In operation, coarse position control is implemented by pneumatic supports 302 and 304 to maintain an equilibrium position of mounting enclosure 122 with respect to support enclosure 202 along directional vectors 440 and 470 as discussed above in relation to FIG. 4. Fine position control, however, utilizes an MR support that is not fixed in a vertical relationship with respect to mounting enclosure 122. Instead, the MR support is coupled between support enclosure 202 and/or platform 120 and right-angle gear drive 528 to reduce the vertical relationship of the MR support between mounting enclosure 122 and platform 120.

As such, actuation of the MR support does not extend piston 520 along a range of stroke whose direction is parallel to directional vectors 440 and 470. Instead, piston 520 extends along a range of stroke whose direction may range between one that is orthogonal to directional vectors 440 and 470 and one that is just short of parallel to directional vectors 440 and 470. As the direction of the range of stroke of piston 520 approaches one that is orthogonal to directional vectors 440 and 470, the amount of vertical space required between mounting enclosure 122 and platform 120 reduces in proportion to the sine of the angle formed between the direction of stroke of piston 520 and platform 120.

In operation, the range of stroke of piston 520 actuates right-angle gear drive 528 to rotate right-angle gear drive 528 in a direction that is indicated by rotational vector 522. An upward movement of mounting enclosure 122, for example, may cause piston 530 to extend. In response, right-angle gear drive 528 may rotate clockwise to cause piston 520 to extend. However, the movement of piston 520 is resisted by the damper force exerted by the associated MR fluid surrounding piston 520 as discussed above. As such, an upward movement of mounting enclosure 122 is resisted by MR piston 520 through rotational actuation of right-angle gear drive 528.

A downward movement of mounting enclosure 122, on the other hand, may cause piston 530 to retract. In response, right-angle gear drive 528 may rotate counter-clockwise to cause piston 520 to retract. However, the movement of piston 520 is resisted by the damper force exerted by the associated MR fluid surrounding piston 520 as discussed above. As such, a downward movement of mounting enclosure 122 is resisted by MR piston 520 through rotational actuation of right-angle gear drive 528.

As discussed above in relation to components 480-490 of FIG. 4, a variable damper force may either be programmably static, or adaptive, when applied to piston 520 to effectuate "fine tuned" MR suspension control, while minimizing the vertical separation required between mounting enclosure 122 and platform 120 through the utilization of right angle gear drive 528.

Figure 6A:
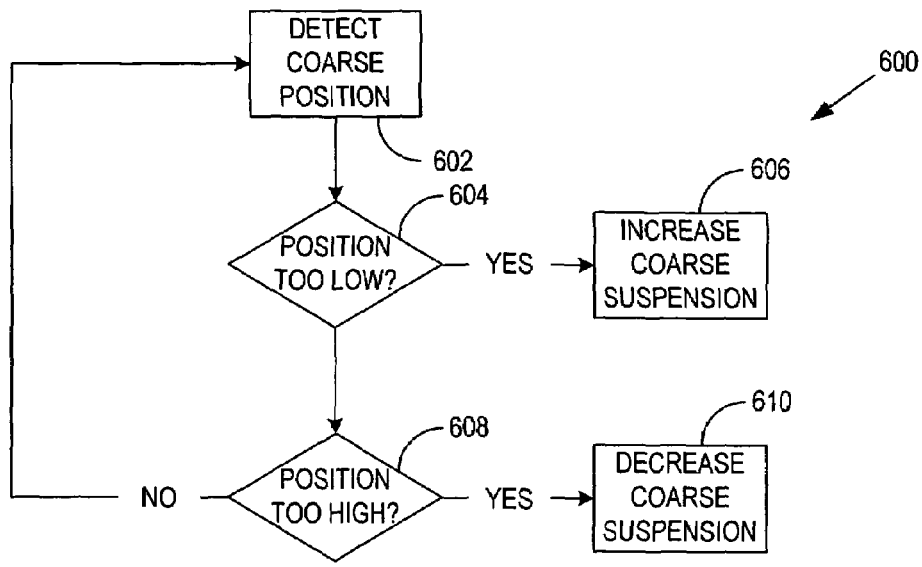
FIG. 6A illustrates an exemplary flow diagram of a method of providing coarse suspension control.

Turning to FIG. 6A, a method of coarse suspension control is exemplified via flow diagram 600 and is described in relation to FIGS. 4 and 5. In step 602, a position of mounting enclosure 122 is detected via magnetic sensors 430,432 and 466,468. Since the weight distribution along a longitudinal axis depicted by directional vector 442 may be non-uniform, sensors 430,432 detect vertical movement along a vertical axis depicted by directional vector 440 and sensors 466,468 independently measure vertical movement along a vertical axis depicted by directional vector 470.

Should mounting enclosure 122 be deflected below its equilibrium position, as detected in step 604 by either of sensors 430,432 and/or 466,468, then signal 434 and/or signal 474 is dispatched to compressors 436 and/or 472 to counteract the downward displacement. In particular, compressors 436 and/or 472 inject air into pneumatic support components 302 and/or 304 in response to signals 434 and/or 474 to increase the magnitude of coarse suspension provided to mounting enclosure 122 as in step 606.

Should mounting enclosure 122 be deflected above its equilibrium position on the other hand, as detected in step 608 by either of sensors 430,432 and/or 466,468, then signal 434 and/or signal 474 is dispatched to compressors 436 and/or 472 to counteract the upward displacement. In particular, release valves within compressors 436 and/or 472 cause air to be released from pneumatic support components 302 and/or 304 in response to signals 434 and/or 474 to decrease the magnitude of coarse suspension provided to mounting enclosure 122 as in step 610.

Figure 6B:
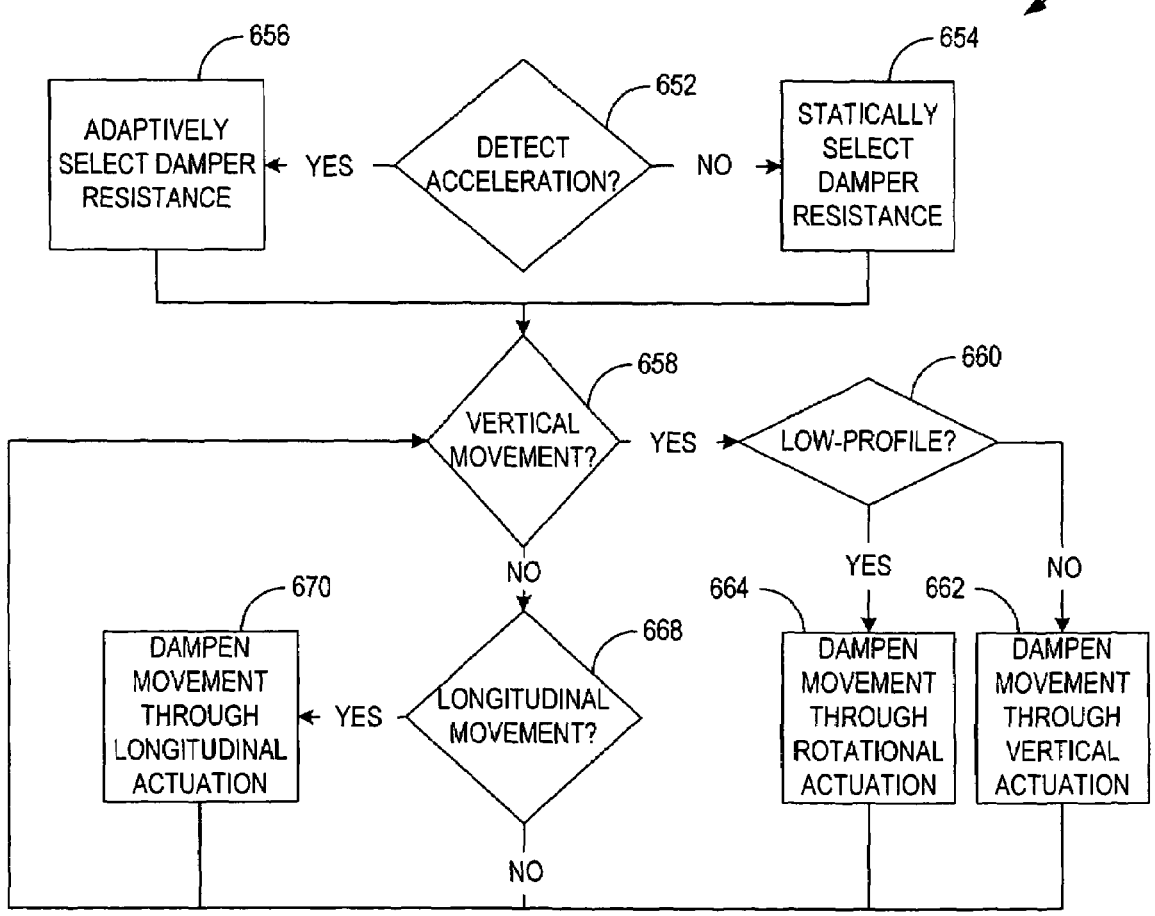
FIG. 6B illustrates an exemplary flow diagram of a method of providing fine suspension control.

Turning to FIG. 6B, a method of fine suspension control is exemplified via flow diagram 650 and is described in relation to FIGS. 4 and 5. In step 652, detection of acceleration forces is either activated or deactivated. If activated, then accelerometers 486, 426, and 462 are selected in step 656 to provide adaptive control signals to PWMs 490, 422, and 458, respectively, to indicate the magnitude and direction of acceleration forces measured for appropriate selection of damper resistance. If deactivated, on the other hand, then acceleration forces are not detected and potentiometers 488, 424, and 460 are selected in step 654 to provide programmably static control signals for static selection of damper resistance.

If vertical movement is detected in step 658, then either a low-profile, or a normal profile, mode of vertical suspension is provided. If vertical suspension is provided as exemplified in FIG. 4, then kinetic energy is dampened through substantially vertical actuation of MR piston 484 as in step 662. The amount of damper resistance applied to piston 484 being determined in either of steps 654 or 656 as discussed above.

If, on the other hand, vertical suspension is provided as exemplified in FIG. 5, then kinetic energy is dampened through rotational actuation of MR piston 520 to implement a low-profile mode of vertical suspension. In particular, the range of stroke of piston 520 actuates right-angle gear drive 528 to rotate right-angle gear drive 528 in a direction that is indicated by rotational vector 522. An upward movement of mounting enclosure 122, for example, may cause piston 530 to extend. In response, right-angle gear drive 528 may rotate clockwise to cause piston 520 to extend. However, the movement of piston 520 is resisted by the damper force exerted by the associated MR fluid surrounding piston 520 as discussed above. As such, an upward movement of mounting enclosure 122 is resisted by MR piston 520 through rotational actuation of right-angle gear drive 528.

A downward movement of mounting enclosure 122, on the other hand, may cause piston 530 to retract. In response, right-angle gear drive 528 may rotate counter-clockwise to cause piston 520 to retract. However, the movement of piston 520 is resisted by the damper force exerted by the associated MR fluid surrounding piston 520 as discussed above. As such, a downward movement of mounting enclosure 122 is resisted by MR piston 520 through rotational actuation of right-angle gear drive 528. The amount of damper resistance applied to piston 520 being determined in either of steps 654 or 656 as discussed above.

Kinetic energy, as determined in step 668, may also be dampened along a longitudinal axis as depicted by directional vector 442. In particular, both sides of mounting enclosure 122 are "soft" mounted to structural enclosure 202 through MR supports 204 and 206. Damper resistance of MR supports 204 and 206 may be adaptively, or statically, programmed as discussed above. In operation, MR supports 204 and 206 substantially absorb kinetic energy that is applied to mounting enclosure 122 along a longitudinal direction as depicted by directional vector 442.

Other aspects and embodiments of the present invention will be apparent to those skilled in the art from consideration of the specification and practice of the invention disclosed herein. For example, the payload installed within mounting enclosure 122 may not necessarily correspond to electronic components. Rather, the payload may instead correspond to other shock sensitive materials, such as nitroglycerin, which requires transportation mechanisms that minimize the amount of kinetic energy transferred, so as to minimize the possibility of premature detonation. Protection against premature detonation may be further provided by environment proof enclosure 102 when constructed with armored materials as discussed above.

Furthermore, items requiring a fixed storage temperature range, such as food, drink, or other temperature sensitive items, may also be transported in an environment that is temperature controlled and virtually free from multi-dimensional acceleration forces. Additionally, while the mobile enclosures exemplified herein provide for self-propulsion, it is appreciated that mobility control device 106 of FIG. 1 may instead be eliminated as exemplified in FIGS. 2 and 3. As such, non-mobile enclosures, such as may be required in maritime, aeronautical, or seismic applications, may be provided to implement kinetic energy isolation for the payload contained within the non-mobile enclosures. In such instances, the non-mobile enclosures of FIGS. 2 and 3 may instead be mounted directly to a platform, e.g., floor space, as may be provided by the particular non-mobile application, such as in an equipment room of telecommunications facility.

It is intended, therefore, that the specification and illustrated embodiments be considered as examples only, with a true scope and spirit of the invention being indicated by the following claims.

What is claimed is:

1. An electronic component transport system, comprising:
   a platform having first and second surfaces;
   a mobility control device coupled to the first surface of the platform and adapted to provide directional propulsion of the platform;
   a first enclosure coupled to the second surface of the platform;
   a second enclosure coupled to the second surface of the platform and the first enclosure, the second enclosure being adapted to accept a plurality of electronic components;
   a suspension system coupled to the first and second enclosures and to the second surface of the platform and adapted to isolate a position of the second enclosure from relative position variations of the platform and the first enclosure, the suspension system including,
      a first suspension device coupled to the second enclosure and the second surface of the platform, the first suspension device adapted to maintain a position of the second enclosure between a minimum and a maximum distance in a first direction relative to the first enclosure; and
      a second suspension device coupled to the second enclosure and adaptively programmed to dampen movement of the second enclosure between the minimum and the maximum distance relative to the first enclosure; and
   a third enclosure encompassing the first and second enclosures, the third enclosure including,
      a power conditioner coupled to receive an input power signal and adapted to provide a conditioned power signal to the plurality of electronic components in response to the input power signal; and
      an environment control unit adapted to maintain the plurality of electronic components at a substantially constant temperature.

2. The electronic component transport system of claim 1, wherein the first suspension device comprises:
   a first pneumatic support coupled to a first portion of the second enclosure and adapted to pneumatically maintain a position of the first portion of the second enclosure between the minimum and the maximum distance relative to a first portion of the first enclosure in response to a first position signal; and
   a second pneumatic support coupled to a second portion of the second enclosure and adapted to pneumatically maintain a position of the second portion of the second enclosure between the minimum and the maximum distance relative to a second portion of the first enclosure in response to a second position signal.

3. The electronic component transport system of claim 2, wherein the first suspension device further comprises:
   a first sensor adapted to detect the position of the first portion of the second enclosure between the minimum and the maximum distance relative to the first portion of the first enclosure and to provide the first position signal in response to the detected position; and
   a second sensor adapted to detect the position of the second portion of the second enclosure between the minimum and the maximum distance relative to the second portion of the first enclosure and to provide the second position signal in response to the detected position.

4. The electronic component transport system of claim 3, wherein the first suspension device further comprises:
- a first compressor coupled to the first sensor and the first pneumatic support and adapted to maintain a pressure of the first pneumatic support to maintain the position of the first portion of the second enclosure between the minimum and the maximum distance relative to the first portion of the first enclosure; and
- a second compressor coupled to the second sensor and the second pneumatic support and adapted to maintain a pressure of the second pneumatic support to maintain the position of the second portion of the second enclosure between the minimum and the maximum distance relative to the second portion of the first enclosure.

5. The electronic component transport system of claim 1, wherein the second suspension device comprises:
- a conductive element; and
- a magnetorheological device displaced within the conductive element and coupled to the second enclosure and the platform.

6. The electronic component transport system of claim 5, wherein the second suspension device further comprises:
- a pulse width modulator coupled to the conductive element and adapted to provide a pulse width modulated signal to the conductive element, the conductive element being adapted to produce a variable magnitude magnetic field in response to the pulse width modulated signal; and
- an accelerometer coupled to the pulse width modulator and adapted to provide an adaptive control signal to the pulse width modulator, the pulse width modulator being adapted to adjust a duty cycle of the pulse width modulated signal in response to the adaptive control signal.

7. The electronic component transport system of claim 1, further comprising a third suspension device coupled between the first and second enclosures and adaptively programmed to dampen movement of the second enclosure, the movement being in a second direction orthogonal to the first direction.

8. The electronic component transport system of claim 1, further comprising a wireless interface coupled to the third enclosure and adapted to provide data access to the plurality of electronic components.

9. The electronic component transport system of claim 8, wherein the wireless interface comprises a multiple-in, multiple-out (MIMO) wireless interface.

10. The electronic component transport system of claim 8, wherein the wireless interface comprises a keyboard, video, mouse (KVM) wireless switch.

11. The electronic component transport system of claim 1, further comprising a security device adapted to authenticate access to the first and second enclosures.

12. A mobile equipment rack assembly, comprising:
- a platform adapted to provide directional propulsion;
- a first rack coupled to the platform;
- a second rack coupled to the first rack and the platform, the second rack being encapsulated by the first rack; and
- a shock absorption unit coupled to the first and second racks, the shock absorption unit including,
  - a weight bearing device coupled to the second rack and adapted to maintain a position of the second rack within a first range of distance in a first direction relative to the first rack; and
  - a dampening device coupled to the second rack, the dampening device being adaptively programmed to dampen movement of the second rack within the first range of distance.

13. The mobile equipment rack assembly of claim 12, wherein the weight bearing device comprises:
- a first pneumatic support coupled to a first portion of the second rack and adapted to pneumatically maintain a position of the first portion of the second rack between the first range of distance relative to a first portion of the first rack in response to a first position signal; and
- a second pneumatic support coupled to a second portion of the second rack and adapted to pneumatically maintain a position of the second portion of the second rack between the first range of distance relative to a second portion of the first rack in response to a second position signal.

14. The mobile equipment rack assembly of claim 13, wherein the weight bearing device further comprises:
- a first sensor adapted to detect the position of the first portion of the second rack between the first range of distance relative to the first portion of the first rack and to provide the first position signal in response to the detected position; and
- a second sensor adapted to detect the position of the second portion of the second rack between the first range of distance relative to the second portion of the first rack and to provide the second position signal in response to the detected position.

15. The mobile equipment rack assembly of claim 14, wherein the weight bearing device further comprises:
- a first compressor coupled to the first sensor and the first pneumatic support and adapted to maintain a pressure of the first pneumatic support to maintain the position of the first portion of the second rack between the first range of distance relative to the first portion of the first rack; and
- a second compressor coupled to the second sensor and the second pneumatic support and adapted to maintain a pressure of the second pneumatic support to maintain the position of the second portion of the second rack between the first range of distance relative to the second portion of the first rack.

16. The mobile equipment rack assembly of claim 12, wherein the dampening device comprises:
- a conductive element; and
- a magnetorheological device displaced within the conductive element and coupled to the second rack and the platform.

17. The mobile equipment rack assembly of claim 16, wherein the dampening device further comprises:
- a pulse width modulator coupled to the conductive element and adapted to provide a pulse width modulated signal to the conductive element, the conductive element being adapted to produce a variable magnitude magnetic field in response to the pulse width modulated signal; and
- an accelerometer coupled to the pulse width modulator and adapted to provide an adaptive control signal to the pulse width modulator, the pulse width modulator being adapted to adjust a duty cycle of the pulse width modulated signal in response to the adaptive control signal.

18. The mobile equipment rack assembly of claim 12, wherein the dampening device comprises:
- a right-angle drive coupled to the second rack and the platform; and
- a magnetorheological device coupled to the right-angle drive and the platform, wherein the magnetorheological device is adapted to actuate through the right-angle drive to dampen movement of the second rack within the first range of distance.

19. An equipment rack assembly, comprising:
a first rack coupled to a platform;
a second rack coupled to the first rack and the platform;
a shock absorption unit coupled to the first and second racks, the shock absorption unit including,
- a weight bearing device coupled to the second rack and the platform and adapted to maintain a position of the second rack within a first range of distance relative to the first rack; and
- a dampening device coupled to the second rack and adaptively programmed to dampen movement of the second rack within the first range of distance.

20. The equipment rack assembly of claim 19, wherein the dampening device comprises:
- a right-angle drive coupled to the second rack and the platform; and
- a magnetorheological shock absorber coupled to the right-angle drive and the platform, wherein the magnetorheological shock absorber is adapted to actuate through operation of the right-angle drive to dampen movement of the second rack within the first range of distance.

* * * * *